(12) United States Patent
Carlin et al.

(10) Patent No.: US 8,137,749 B2
(45) Date of Patent: Mar. 20, 2012

(54) METHOD OF ALUMINIZATION IN THE VAPOR PHASE ON HOLLOW METAL PARTS OF A TURBOMACHINE

(75) Inventors: Maxime Francois Roger Carlin, Paris (FR); Lucie Marie Ida Lanciaux, Paris (FR); Philippe Jacques Andre Le Henanff, Blanc Mesnil (FR)

(73) Assignee: SNECMA, Paris (FR)

( * ) Notice: Subject to any disclaimer, the term of this patent is extended or adjusted under 35 U.S.C. 154(b) by 798 days.

(21) Appl. No.: 12/245,034

(22) Filed: Oct. 3, 2008

(65) Prior Publication Data
US 2009/0092753 A1   Apr. 9, 2009

(30) Foreign Application Priority Data
Oct. 3, 2007 (FR) ...................... 07 06935

(51) Int. Cl.
*B05D 7/22* (2006.01)
(52) U.S. Cl. .................... 427/237; 427/239; 427/255.39
(58) Field of Classification Search .................. 427/237, 427/239, 255.39
See application file for complete search history.

(56) References Cited

U.S. PATENT DOCUMENTS

| | | | | |
|---|---|---|---|---|
| 5,068,127 A | * | 11/1991 | Fournes et al. | 427/237 |
| 5,071,678 A | * | 12/1991 | Grybowski et al. | 427/253 |
| 5,221,354 A | * | 6/1993 | Rigney | 118/725 |
| 5,334,417 A | | 8/1994 | Rafferty et al. | |
| 5,997,604 A | * | 12/1999 | Rafferty et al. | 75/233 |
| 6,224,941 B1 | * | 5/2001 | Chen et al. | 427/252 |
| 6,326,057 B1 | * | 12/2001 | Das et al. | 427/255.26 |
| 6,521,294 B2 | * | 2/2003 | Rigney et al. | 427/253 |
| 2003/0072878 A1 | * | 4/2003 | Fournes et al. | 427/250 |
| 2004/0151834 A1 | * | 8/2004 | Wustman et al. | 427/237 |
| 2008/0057193 A1 | * | 3/2008 | Mantkowski | 427/237 |

FOREIGN PATENT DOCUMENTS

| EP | 1 577 415 A1 | * | 9/2005 |
|---|---|---|---|
| FR | 2 830 874 | | 4/2003 |

OTHER PUBLICATIONS

U.S. Appl. No. 12/245,052, filed Oct. 3, 2008, Carlin, et al.

\* cited by examiner

*Primary Examiner* — William Phillip Fletcher, III
(74) *Attorney, Agent, or Firm* — Oblon, Spivak, McClelland, Maier & Neustadt, L.L.P.

(57) ABSTRACT

A method of aluminization by deposit in the vapor phase for protection against oxidation at high temperature of a metal part of a turbomachine. The part includes a cavity with an opening that can be accessed from the outside. A halide is formed by reaction between a halogen and a metal donor containing aluminum, then the halide is transported by a carrier gas to come into contact with the metal part, the metal donor being placed at least partly in the cavity. The metal donor is in the form of a pellet obtained by hot sintering under pressure of a mixture of metal powder.

20 Claims, 2 Drawing Sheets

METHOD OF ALUMINIZATION IN THE VAPOR PHASE ON HOLLOW METAL PARTS OF A TURBOMACHINE

BACKGROUND OF THE INVENTION

1. Field of the Invention

The present invention relates to the deposit of an aluminum coating on a metal part, notably on a hollow metal part comprising a cavity with an opening allowing access to this cavity. Its object is more particularly the application of such a coating on hollow blades of a turbomachine incorporating a cooling fluid distribution sleeve.

2. Discussion of the Background

A gas turbine engine, as used for propulsion in the aviation field, comprises an atmospheric air inlet which communicates with one or more compressors, usually including a fan, rotated about one and the same axis. The main flow of this air after having been compressed supplies a combustion chamber placed annularly about this axis and is mixed with a fuel in order to provide hot gases downstream to one or more turbines through which the latter are expanded, the turbine rotors driving the compression rotors. The engines operate at a turbine inlet driving gas temperature that is sought to be as high as possible because performance is related thereto. For this purpose, the materials are selected to withstand these operating conditions and the walls of the parts swept by the hot gases, such as the upstream guide vanes or the movable turbine fins, are provided with cooling means. Furthermore, because of their metal constitution made of nickel-based or cobalt-based superalloy, it is also necessary to protect the latter from the erosion and corrosion caused by the components of the driving gases at these temperatures.

A known method for protecting these parts is to deposit an aluminum-based coating on the surfaces prone to attack by the gases. Aluminum attaches to the substrate by metal interdiffusion and forms an oxide-protective layer on the surface. The thickness of the protective layer is of the order of a few tens of microns.

The present invention relates to the technique, known per se, of depositing aluminum in the vapor phase or else called aluminization by deposit in the vapor phase. According to the method, the parts to be treated are placed in an enclosure in which the atmosphere consists of a mixture of an inert or reducing gas, for example argon or hydrogen, and an active gas comprising an aluminum halide. At the reaction temperature, between 900° C. and 1150° C., the halide decomposes on the surface of the part into gaseous halogen and aluminum which diffuses into the metal.

The halide is produced by placing in the enclosure with the parts to be treated metal blocks of aluminum or of aluminum alloy which form the donor, in the presence of granules of a halogen, chlorine or fluorine compound, which form the activator. The inert gas is made to travel over the activator at a temperature allowing the sublimation of the halogen which is carried to the donor and with which it reacts to produce the metal halide which, at this temperature, is in vapor form. The halide then decomposes on contact with the metal substrate to be coated allowing the aluminum to be deposited; the gaseous halogen is reformed.

When the stator parts also, although mobile, are provided with inner cavities swept by a cooling fluid, air drawn from the compressor, it has been noted that the walls of these cavities were also subject to corrosion. Returns of parts used on engines working in certain environments have shown an attack of these surfaces. For example, internal corrosion of the upstream guide vanes, releases of flakes of corrosion in the cavity of the upstream guide vanes, the blocking of the trailing edge vent holes, etc. have been noted. Protection for these portions of parts is therefore also necessary.

SUMMARY OF THE INVENTION

The method of aluminization by deposit in the vapor phase is appropriate in principle for applying a protective coating because the carrier gas and the active components are likely to enter the narrow passageways for the circulation of the cooling fluid because these passageways are open. Reality shows that this is not the case. The thickness of the protective layer is not uniform; it reduces sharply from the orifices providing access to the cavities. Furthermore, accumulations form at the vent holes of the cavities reducing the passageway section and the cooling properties of the part.

Patent application FR 2830874 in the name of the applicant describes a method of aluminization by deposit in the vapor phase of metal turbomachine parts provided with holes and cavities communicating with the outside according to which a gaseous precursor of the deposit to be achieved comprising an aluminum compound is brought with the aid of a carrier gas into contact with the surfaces of the part placed in an enclosure, the carrier gas is either helium or argon and the pressure in the enclosure is chosen so that the mean free path of the molecules of the carrier gas is twice as high as that of the molecules of argon under atmospheric pressure. The mean free path of the molecules is usually defined as the ratio $1/P*D^2$ where P is the pressure prevailing in the enclosure and D the molecular diameter.

By the lengthening of the mean free path of the molecules of the carrier gas, the diffusion of the halide in the inner channels is increased and the thickness of the deposit in the zones less accessible by the conventional method is increased; the overall protection is therefore improved. The increase in the free travel results either from the choice of the carrier gas, there helium, or of a reduction in the pressure as can be deduced from the above formula.

The subject of the invention is a method variant making it possible to obtain a coating of the walls of the inner cavities over the whole surface with a sufficient thickness.

The invention relates to the hollow parts with a cavity and an opening at least through which the cavity communicates and can be accessed from the outside. It relates more particularly to such parts, provided with an inner sleeve inside the cavity, fitted through the opening and assembled with the part.

Such a part is represented in FIG. 1. It is the section of an upstream guide vane of a low-pressure stage in a bypass gas turbine engine. The blade 1 of the upstream guide vane comprises a portion manufactured by casting metal in a shell mold. This portion, crosshatched in the figure, is formed of a hollow airfoil 2 between two platforms 3 and 4. The cavity of the airfoil 2 communicates through its two ends, respectively on one side with an opening 5 for the supply of cooling fluid and on the other side with a fluid outlet 6. Inside the cavity of the airfoil 2, a sleeve 9 of substantially cylindrical shape is placed. The sleeve is welded or brazed on the side of the opening 5 for supplying cooling air by a peripheral weld or braze along the edge of the opening of the cavity. The other end of the sleeve is engaged in a cylindrical housing communicating with the outlet 6, without being welded thereto in order to allow the relative expansion of the sleeve relative to the airfoil during the transitional operating steps. The sleeve is perforated over its length and arranges a space with the wall of the airfoil so that the cooling air originating from the air supply opening 5 partly passes through the perforations of the sleeve and forms a plurality of air jets cooling the wall of the airfoil by impact and convection. This air is then discharged through the vents arranged close to the trailing edge of the airfoil. The air that has not passed through the wall of the sleeve is guided toward the opening 6 to be conducted toward other portions of the machine.

In manufacture, the sleeve 9, made separately from the airfoil, is fitted into the airfoil by being slid through the orifice 5 then brazed close to the mouth as mentioned above. The bottom portion, in the figure, remains free to expand and to slide in the housing formed by the opening 6.

According to the invention, the aluminizing deposit is substantially improved inside the cavity with the following method, applicable to any part comprising a cavity that can be accessed from the outside:

The aluminization method by deposit in the vapor phase for protection against oxidation at high temperature of a metal part of a turbomachine, Said part comprising a cavity and an opening that can be accessed from the outside, According to which method a halide is formed by reaction between a halogen and a metal donor containing aluminum, then the halide is transported by a carrier gas to come into contact with said metal part, Said metal donor being placed at least partly in said cavity, Is notable in that the metal donor is in the form of a pellet obtained by hot sintering under pressure of a mixture of metal powder.

The metal comprising the pellet comprises aluminum, preferably in combination with one of the metals Cr, Ni, Co or Fe. The aluminum is in proportion comprised between 30 and 80% atomic in the pellet, more particularly in proportion comprised between 45 and 70% atomic.

By providing a donor inside the cavity, consisting of the pellet, an effective deposit is allowed. Notably the problem of accessibility to the part from the outside is solved while controlling the quantity of inner donor by the length of the pellet for example.

More particularly, the pellet also comprises at least one element for improving the resistance to oxidation comprised in the following group (Hf, Y, Zr, Si, Ti, Ta, Pt, Pd, Ir).

The method applies to parts made of nickel-based or cobalt-based superalloy such as an upstream guide vane blade with an inner cooling fluid distribution cavity. In this case, the pellet is inserted through the cooling fluid inlet opening.

Document EP1577415 is known which relates to a method of aluminization in the vapor phase of turbomachine parts such as hollow mobile blades of a turbine according to which strips consisting of 85% in weight of aluminum-based powder is placed inside the part, the rest being formed of an organic binder possibly with an activator. The organic binder is carbonized during the treatment and the portion of the strip that has not been consumed may be easily extracted from the cavity. Such a strip is already known per se and described in document U.S. Pat. No. 5,334,417. The solution of the invention allows an easy manipulation of the pellet, with the advantage, because of the use of a purely metallic material, of an absence of organic residue. There is therefore no pollution. Furthermore, the pellet being able to be machined into the desired shapes allows simplified utilization for the user.

Finally, the pellet does not require any specific removal operation, the residues being eliminated in the usual cleaning operations.

Now a nonlimiting embodiment of the invention is described with reference to the drawings in which:

DETAILED DESCRIPTION OF THE PREFERRED EMBODIMENTS

Figure 2:
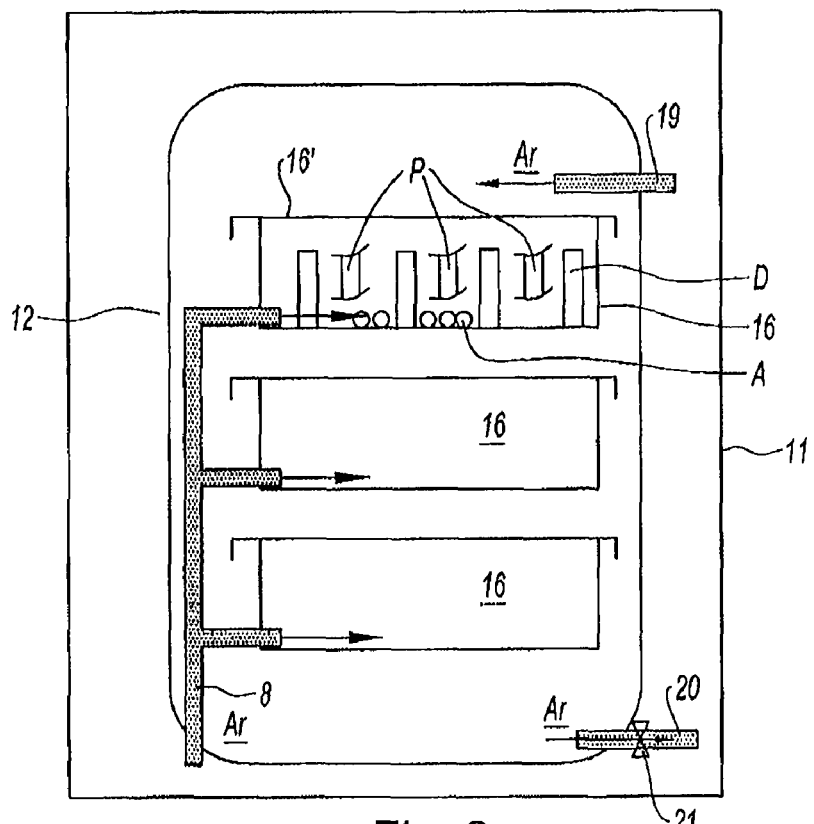
FIG. 2 shows an aluminization installation that is suitable for applying the method of the invention.

FIG. 2 shows very schematically a conventional installation for aluminization by deposit in the vapor phase in which the method of the invention is applied.

An enclosure 12 is mounted inside a furnace 4 capable of heating the parts to a temperature of 1200° C. Placed in this enclosure are boxes 16, in this instance three superposed boxes, with a cover 16'. These boxes contain the parts to be treated P, for example turbine upstream guide vanes, with the metal donor D in the form of powder or blocks and the activator A, for example $NH_4F$ or $NH_4Cl$. The enclosure 12 in this instance comprises a supply 18 of purge carrier gas, a supply 19 of flushing carrier gas and a discharge 20 controlled by a valve 21. This flushing function is however optional in current installations.

After having placed the parts, the donor and the activator in the boxes 16, the user begins by flushing the enclosure 12 by introducing the carrier gas, argon for example, through the duct 18. The supply is interrupted when the air of the enclosure has been replaced by the argon. The heating of the furnace is then actuated while supplying the enclosure with argon through the duct 19. The excess gas is discharged through the duct 20. At the temperature for the activation of the activator A, the halogen, chlorine or fluorine is released. Coming into contact with the donor, the halogen reacts with the metal and forms a halide. The halide vapor thus formed circulates inside the boxes 16 and comes into contact with the metal parts P. At this moment, the halide decomposes and releases the metal which is deposited on the part.

The argon is inserted at all times through the duct 19 into the enclosure 12 and is discharged through the duct 20. The duration of treatment is between 2 and 6 hours.

According to the invention, the donor is brought closer to the cavity using a donor pellet 10.

Before beginning the treatment, the donor pellet 10 is inserted through the opening 5.

The pellet has been manufactured according to the powder metallurgy technology.

The technique consists in mixing the components in the form of metal powder then in consolidating the mixture thus prepared by sintering under pressure. As is known, sintering is a process causing the agglomerated mixture of individual particles to change by heat treatment under the effect of the pressure in question. This method makes it possible to cause the components to react in whole or in part in order to form intermetallic elements that will serve as the donor. In this way, a solid block is obtained that is less porous than the initial porosity. This process is also characterized by the maintenance of at least one solid intermetallic phase such as an aluminizing of chrome throughout the heat treatment, and the conservation of a certain stability of shape and dimension.

Figure 1:
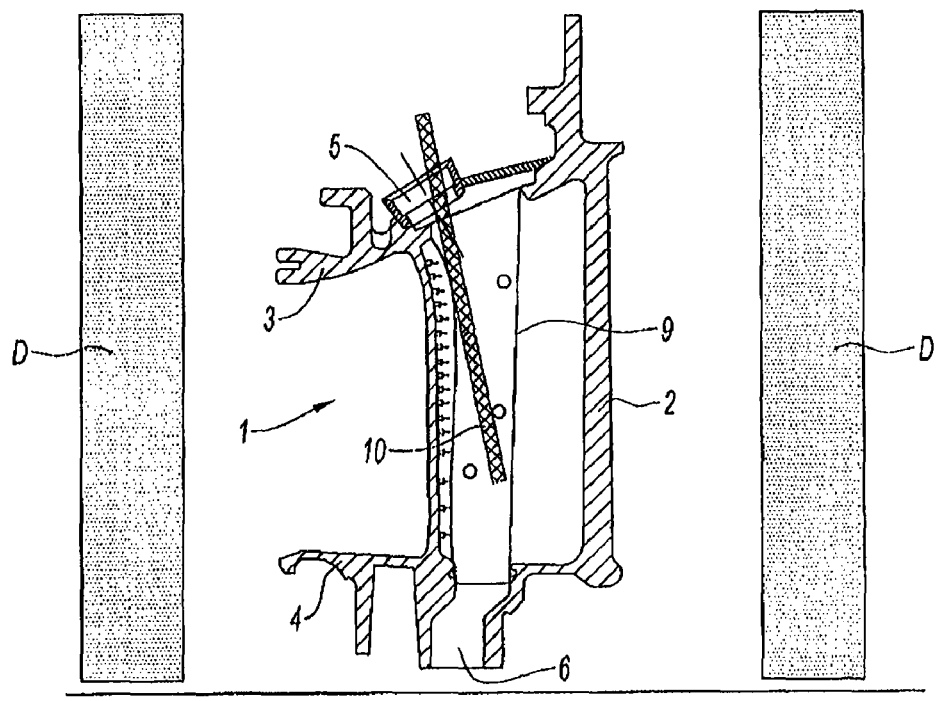
FIG. 1 represents an upstream guide vane blade with an inner cavity and cooling air distribution sleeve fitted in this cavity, a pellet being housed in said sleeve.

After the sintering operation, the pellet may be machined so that its form is suited to the space available for its insertion into the cavity. As shown in FIG. 1 it is a stick 10 inserted in the cavity.

The advantage of this solution relative to another solution that would consist in placing a donor basket inside the cavity, is to allow the treatment of the part already assembled. The use of a basket in an intermediate step would make it necessary to treat the part without the sleeve and then to install the sleeve onto the part whose walls are coated with a layer of aluminum which requires a particular adaptation of the brazing means.

Furthermore, it is not necessary to clean the inside of the cavity of donor residues according to a specific method. The residues are eliminated by the conventional cleaning operations already provided.

Figure 3:
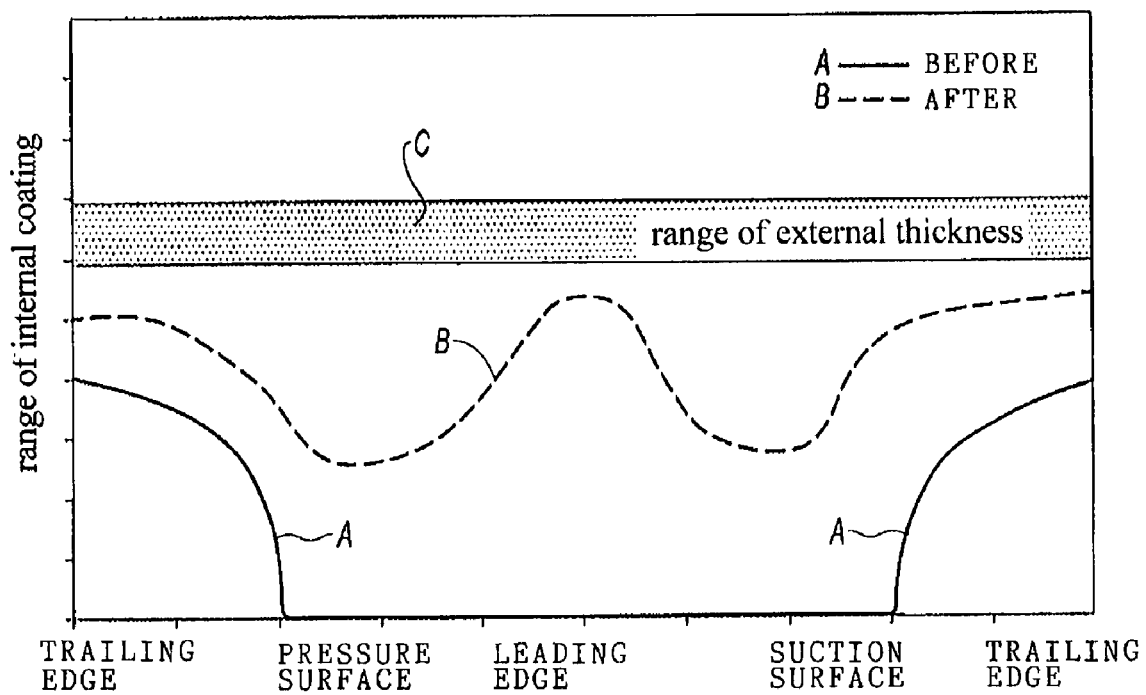
FIG. 3 is a graph showing the variation in the thickness of the layer deposited on the walls of inner fixed fin cavities according to a technique of the prior art and the technique of the invention.

FIG. 3 shows, on a graph, the thickness of the layer of aluminum formed on the surface of the inner walls of the blades. Note that, according to the prior art, this thickness A is virtually zero on the side of the leading edge on either side along a portion of the pressure surface and the suction surface. According to the method, a more uniform thickness B, for example between 50 and 70 μm, is obtained, both on the periphery of the blade and between the root and the tip of the blade.

The thickness of the inner layer is to be compared with that which is found after treatment on the outer surface of the part which is shown at C in FIG. 3.

The invention claimed is:

1. A method for protecting a metal part of a turbomachine, said part comprising a cavity with an opening that can be accessed from the outside, against oxidation at high temperature by vapor phase aluminizing, the method comprising:
forming a halide by reaction between a halogen and an aluminum-containing metal donor; and
transporting the halide by a carrier gas to come into contact with said metal part,
wherein a portion of the metal donor is in the form of a pellet obtained by hot sintering a mixture of metal powder under pressure, and
wherein the pellet is placed at least partly inside said cavity, thereby resulting in vapor phase aluminization of the inside of the cavity.

2. The method of claim 1, wherein the metal powder comprises aluminum and a metal selected from the group consisting of Cr, Ni, Co and Fe.

3. The method of claim 2, wherein the aluminum is present in an amount between 30 and 80 atom percent.

4. The method of claim 3, wherein the aluminum is present in an amount between 45 and 70 atom percent.

5. The method of claim 2, wherein the metal powder further comprises at least one element for imparting oxidation resistance selected from the group consisting of Hf, Y, Zr, Si, Ti, Ta, Pt, Pd, and Ir.

6. The method of claim 5, wherein the at least one element for imparting oxidation resistance is Hf.

7. The method of claim 5, wherein the at least one element for imparting oxidation resistance is Y.

8. The method of claim 5, wherein the at least one element for imparting oxidation resistance is Zr.

9. The method of claim 5, wherein the at least one element for imparting oxidation resistance is Si.

10. The method of claim 5, wherein the at least one element for imparting oxidation resistance is Ti.

11. The method of claim 5, wherein the at least one element for imparting oxidation resistance is Ta.

12. The method of claim 5, wherein the at least one element for imparting oxidation resistance is Pt.

13. The method of claim 5, wherein the at least one element for imparting oxidation resistance is Pd.

14. The method of claim 5, wherein the at least one element for imparting oxidation resistance is Ir.

15. The method of claim 1, wherein the metal part includes a nickel-based or cobalt-based superalloy.

16. The method of claim 15, wherein the metal part is an upstream guide vane blade with an inner cooling fluid distribution sleeve in the cavity, and the pellet is placed through a cooling fluid inlet opening.

17. The method of claim 1, wherein the metal powder comprises aluminum and Cr.

18. The method of claim 1, wherein the metal powder comprises aluminum and Ni.

19. The method of claim 1, wherein the metal powder comprises aluminum and Co.

20. The method of claim 1, wherein the metal powder comprises aluminum and Fe.

* * * * *